United States Patent [19]

Ueno

[11] Patent Number: 5,272,376
[45] Date of Patent: Dec. 21, 1993

[54] ELECTRODE STRUCTURE FOR A SEMICONDUCTOR DEVICE

[75] Inventor: Hiroshi Ueno, Tokyo, Japan

[73] Assignee: Clarion Co., Ltd., Tokyo, Japan

[21] Appl. No.: 914,049

[22] Filed: Jul. 14, 1992

Related U.S. Application Data

[63] Continuation of Ser. No. 707,586, May 30, 1991, abandoned.

[30] Foreign Application Priority Data

Jun. 1, 1990 [JP] Japan .............................. 2-58199[U]
Jun. 25, 1990 [JP] Japan .............................. 2-67043[U]

[51] Int. Cl.$^5$ .............................................. H01L 23/48
[52] U.S. Cl. ................................. 257/737; 257/741; 257/751; 257/762; 257/763

[58] Field of Search ................ 357/67, 71; 437/183; 257/737, 738, 741, 751, 762, 763, 767, 770, 750

[56] References Cited

U.S. PATENT DOCUMENTS

| | | | |
|---|---|---|---|
| 4,600,600 | 7/1991 | Pammer et al. | 437/183 |
| 4,985,750 | 1/1991 | Hoshino | 357/67 |
| 5,021,300 | 6/1991 | Stacey | 357/71 |
| 5,068,709 | 11/1991 | Egawa et al. | 357/71 |

Primary Examiner—William Mintel
Assistant Examiner—Roy Potter
Attorney, Agent, or Firm—Flynn, Thiel, Boutell & Tanis

[57] ABSTRACT

According to the present invention oxidation of Cu at wire bonding in a pad electrode using a Cu thin film as well as oxidation of Cu at wireless bonding in a bump electrode using a Cu thin film can be prevented.

9 Claims, 2 Drawing Sheets

1

ELECTRODE STRUCTURE FOR A SEMICONDUCTOR DEVICE

This application is a continuation of U.S. Ser. No. 07/707,586, filed May 30, 1991 which is now abandoned.

FIELD OF THE INVENTION

The present invention relates to an electrode structure for a semiconductor device and in particular to improvement of a pad electrode structure and a bump electrode structure for a semiconductor device.

BACKGROUND OF THE INVENTION

As a prior art technique for a pad electrode the applicant of the present application has proposed in JP-UM-63-170944(A) a pad electrode consisting of an Al electrode, on which a Cu thin film is disposed.

The pad electrode thus constructed is reliable against various heat cycles after wire bonding using an Au line and excellent.

On the other hand, as a prior art technique for a bump electrode for wireless bonding, there are known electrode structures by the flip chip method and the TAB (Tap Automated Bonding) method. As an example thereof FIG. 4 shows an electrode structure by the TAB method.

In the Figure, reference numeral 11 is an Si substrate; 12 is an SiO$_2$ oxide film; 13 is an Al pad; 14 is a bonding layer; 15 is a barrier metal; and 16 is a bump. For the bonding layer Ti and Cr; for the barrier metal W, Pt, Ag, Ni and Cu; and for the bump Au, Cu and (Pb/Sn) solder are used principally. Further plating, the vacuum evaporation method, the sputtering method, the CVD method, etc. are used for the formation of the bonding layer 14 and the barrier metal 15 and the bump is formed by plating.

However, in the pad electrode structure described above, the Cu thin film disposed on the Al electrode has a drawback that Cu is oxidized in an oxidizing atmosphere so that wire bonding becomes impossible or initial strength is lowered, because it is heated at wire bonding.

On the other hand, in the bump electrode structure, bonding is effected by the thermal pressure bonding method at about 500° C. As a material for the bump, recently Cu, which is not expensive, is used for the reason that Au is expensive so that fabrication cost is too high. In the case where Cu is used, it is easily oxidized by heat at the bonding or heat, which it receives between the formation of the bump and the bonding, which makes the bonding impossible or gives rise to lowering in initial strength. For this reason, after the formation of the bump the atmosphere at the bonding should not be oxidizing, but it should be inert gas atmosphere such as N$_2$ gas, Ar gas, etc.

OBJECT OF THE INVENTION

The object of the present invention is to provide an electrode structure capable of preventing oxidation of Cu at wire bonding in a pad electrode using a Cu thin film, for which structure wireless bonding of a bump electrode, in which Cu is used as a bump, can be effected in oxidizing atmosphere.

SUMMARY OF THE INVENTION

In order to solve the problematical points described above, an electrode structure for a semiconductor device according to the present invention comprises a thin film provided with anti-oxidation property, extremely thin film property and property of preventing mutual diffusion with respect to Cu disposed on a Cu pad thin film or a Cu bump.

In the electrode structure thus constructed, the Cu pad thin film and the Cu bump are protected by the thin film described above disposed thereon, it is not feared that they are oxidized.

Further, since the thin film described above is easily broken at the bonding, bonding can be effected to Cu.

DETAILED DESCRIPTION

Figure 1:
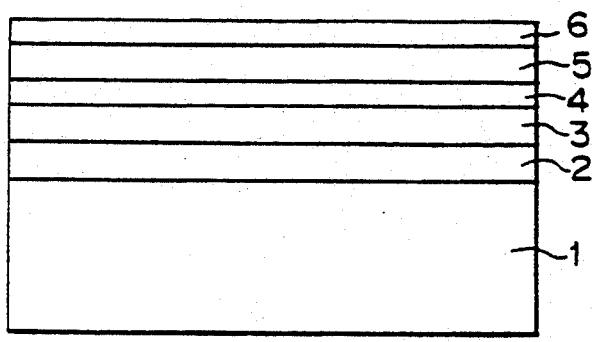
FIG. 1 is a cross-sectional view of a pad electrode structure, which is an embodiment of the present invention.

FIG. 1 shows an example, in which the present invention is applied to a pad electrode structure.

In the Figure, reference numeral 1 is an Si substrate; 2 is an oxide film of SiO$_2$; 3 is an Al film; 4 is a barrier metal of Ti, W, Ta, etc.; and 5 is a Cu film. A thin film 6 provided with an anti-oxidation property, an extremely thin film property, by which it is possible to form an extremely thin film, and an anti-diffusion property, by which negligible mutual diffusion with respect to Cu takes place, formed on this Cu film.

The thin film 6 is made of a metallic material having a high melting point of e.g. Ti, W, Ta, etc. or a compound of Al$_2$O$_3$, TiN, TiSi$_2$, WSi$_2$, etc. and it can be formed by a prior art film forming technique (evaporation method, sputtering method, CVD method, etc.).

The thin film 6 stated above is preferably as thick as possible for preventing oxidation of the Cu film 5. However, since it should be easily broken at wire bonding to form a junction with the Cu film, the thickness thereof should be so small that this can be realized. For example, for Ti a thickness smaller than 4 nm is suitable. In such a case, wire bonding can be effected at a level almost identical to that used under the usual bonding condition.

In a pad electrode thus constructed, since the Cu film 5 is protected by the thin film 6 formed thereon, it is not feared that it is oxidized. Further it is easily broken at wire bonding and a junction can be formed with the Cu film.

Furthermore, for the pad electrode provided with the thin film 6 described above operations can be effected without fear that the Cu film 5 is oxidized in different steps between the formation of the pad and the wire bonding.

Although the embodiment described above relates to a pad electrode in a semiconductor element, IC, LSI, etc. using an Si substrate, the present invention can be realized in a wiring or a wiring formed with a pad electrode in one body.

Figure 2:
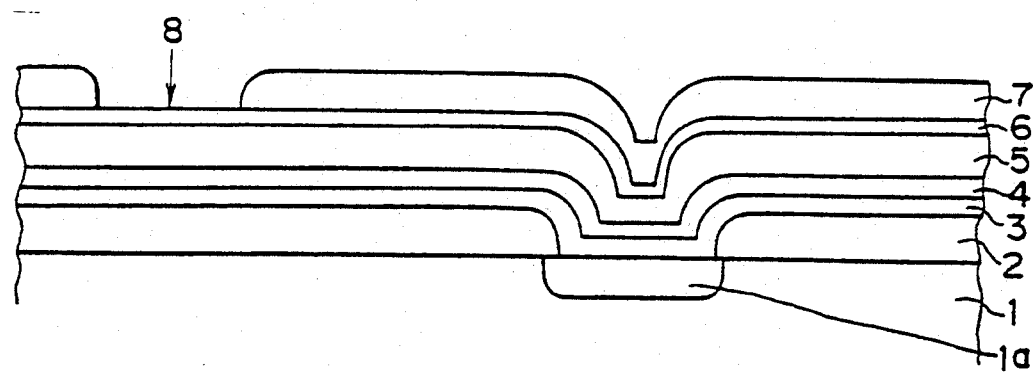
FIG. 2 is a cross-sectional view of a semiconductor device in which the pad electrode and wiring are formed in one body.

FIG. 2 shows an example thereof. In the Figure, reference numeral 1 is an Si substrate; 1a is a substrate diffusion layer; 2 is an oxide film; 3 is an Al film; 4 is a barrier metal; 5 is a Cu film; 6 is an oxidation preventing thin film; 7 is a protecting film made of SiO$_2$, SiN, etc; and 8 is a pad electrode part.

The structure described above has an advantage that it has a higher mechanical strength and a lower electric resistance than Al or Al alloy wiring used widely theretofore. Further, in the structure described above, owing to the presence of the Al layer in the underlayer, contact with the element is never impaired. In the case where it is used in the wiring, since there is a protecting film 7 in the wiring portion, the oxidation preventing thin film 6 may be formed only in the pad electrode portion.

Further, depending on the field of application, the present invention is not necessarily restricted to the structure described above, the barrier metal and the Al film may be omitted and the material may be changed. In short, what is important is that the thin film 6 is disposed for preventing oxidation of the Cu film.

Furthermore, the structure can be used not only for a semiconductor element, IC, LSI, etc. using an Si substrate but also for a pad electrode and wiring for a compound semiconductor by modifying the structure or the material under the Cu layer, as described above.

Figure 3:
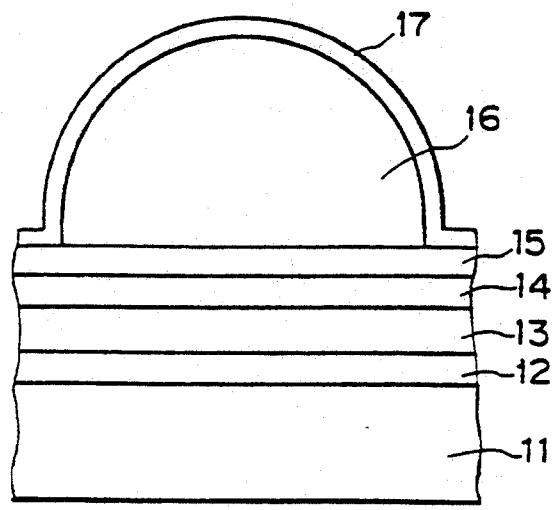
FIG. 3 is a cross-sectional view of a bump electrode structure, which is another embodiment of the present invention.
Figure 4:
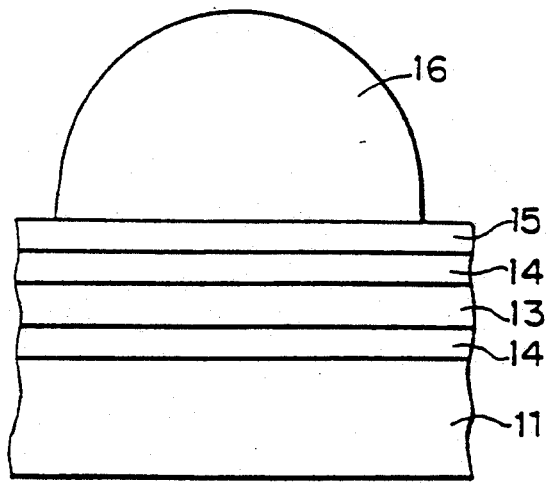
FIG. 4 is a cross-sectional view of a prior art bump structure.

FIG. 3 shows an example, in which the present invention is applied to a bump electrode structure. In the Figure, the items identical or analogous to those indicated in FIG. 4 are denoted by same reference numerals.

That is, reference numeral 11 is an Si substrate; 12 is an oxide film of SiO$_2$; 13 is an Al pad; 14 is a bonding layer; 15 is a barrier metal; and 16 is a Cu bump. A thin film 17 provided with an anti-oxidation property, an extremely thin film property and an anti-diffusion property, by which negligible mutual diffusion takes place with respect to Cu, is formed on this Cu bump 16.

The thin film 17 stated above is also made of a metallic material having a high melting point of Ti, W, Ta, etc. or a compound of Al$_2$O$_3$, TiN, TiSi$_2$, etc. and it can be formed by a prior art film forming technique (evaporation method, sputtering method, CVD method, etc.) similarly to the thin film 6 having the pad electrode structure described previously.

The thin film 17 stated above is preferably as thick as possible for preventing oxidation of the Cu bump. However, since at bonding to an inner lead the inner lead should break the thin film 17 to form a junction thereof with the Cu bump, the thickness thereof should be so small that this can be realized. In such a case, wire bonding can be effected at a level almost identical to that used under the usual bonding condition.

In a bump electrode structure thus constructed, since the Cu bump 16 is protected by the thin film 17 formed thereon, it is not feared that it is oxidized. Further it is easily broken at bonding to the inner lead and a junction can be formed with the Cu bump.

Furthermore, for the bump electrode provided with the thin film 17 described above operations can be effected without fear that the Cu bump 16 is oxidized in different steps from the formation of the pad to the bonding.

Although the embodiment described above relates to a bump electrode in a semiconductor element, IC, LSI, etc. using an Si substrate, the present invention may be realized in a wiring formed with a bump electrode in one body. The structure described above has an advantage that it has a higher mechanical strength and a lower electric resistance than Al or Al alloy wiring used widely heretofore. Further, in the structure described above, owing to Al used in the underlayer, contact with the element is never impaired. In the case where it is used in the wiring in one body, since there is a protecting film (SiO$_2$, SiN, etc.) in the wiring portion, the thin film 17 may be formed only in the bump electrode portion.

Further, depending on the field of application, the present invention is not necessarily restricted to the structure described above, the barrier metal and the Al pad may be omitted and the material may be changed. In short, what is important is that a thin film useful for preventing oxidation of the Cu bump, by which bonding can be effected, is formed.

Still further, the structure can be used not only for a semiconductor element, IC, LSI, etc. using an Si substrate but also for a bump electrode and a bump electrode and wiring formed in one body made of a compound semiconductor by modifying the structure or the material under the Cu layer, as described previously.

As described above, in the case where the present invention is applied to the pad electrode structure, it is possible to form stably a pad electrode and wiring in a simple manner. When this Cu electrode is used, deterioration of the junction portion due to growth of intermetallic compounds in Au wire and the Al pad electrode, which took place heretofore, is produced no more, and thus reliability is increased. Further, when it is used for wiring, owing to the advantage that it has a higher mechanical strength and a lower electric resistance than Al wiring, it is possible to form narrower and thinner wiring and therefore it is useful for increasing the integration density and making the surface of the device flatter.

Further, in the case where the present invention is applied to a bump electrode structure, bonding operation can be effected without paying attention to oxidation of the Cu bump. Consequently it is possible to effect bonding in air and therefore to realize bonding at the Cu bump at a low cost.

What is claimed is:

1. An electrode structure, comprising a pad electrode in the form of a Cu film electrically connected to a surface of a semiconductor substrate, and a further film which is provided on said pad electrode, which has a thickness sufficiently thin so that said further film can be easily broken when bonding of a part to said pad electrode through said further film is carried out in a manner substantially identical to that suitable for bonding said part to said pad electrode in the absence of said further film, which is sufficiently thick so that said further film resists oxidation of said Cu film, and which has a property of preventing mutual diffusion with respect to Cu, wherein when said further film is broken the part forms a junction with said Cu film through a break in said further film.

2. An electrode structure according to claim 1, wherein said further film is made of a metal which is one of Ti, W and Ta.

3. An electrode structure according to claim 1, wherein said further film is made of a compound which is one of Al$_2$O$_3$, TiN, TiSi$_2$, and WSi$_2$.

4. An electrode structure, comprising a bump electrode of Cu formed on a surface of a semiconductor substrate, and a film which is provided on said bump electrode, which has a thickness sufficiently thin so that said film can be easily broken when bonding of a part to said bump electrode through said film is carried out in a manner substantially identical to that suitable for bonding said part to said bump electrode in the absence of said film, which is sufficiently thick so that said film resists oxidation of said Cu bump electrode, and which has a property of preventing mutual diffusion with respect to Cu, wherein when said film is broken the part forms a junction with said Cu bump electrode through a break in said film.

5. An electrode structure according to claim 4, wherein said film is made of a metal which is one of Ti, W and Ta.

6. An electrode structure according to claim 4, wherein said film is made of a compound which is one of $Al_2O_3$, TiN, $TiSi_2$, and $WSi_2$.

7. An apparatus comprising: a semiconductor substrate, a Cu electrode formed on a surface of said substrate, and a film which is provided on and resists oxidation of said electrode, said film having means facilitating breaking of said film during wire bonding to said Cu pad electrode, said means including said film being made of Ti and having a thickness less than 4 nm.

8. An electrode structure, comprising a pad electrode in the form of a Cu film electrically connected to a surface of a semiconductor substrate, and a further film made of Ti provided on said pad electrode and having a thickness less than 4 nm so that said further film can be easily broken during bonding of a part to said pad electrode through said further film, said further film having an anti-oxidation property, and having a property of preventing mutual diffusion with respect to Cu, wherein when said further film is broken the part forms a junction with said Cu film through a break in said further film.

9. An electrode structure, comprising a bump electrode of Cu formed on a surface of a semiconductor substrate, and a film made of Ti provided on said bump electrode and having a thickness less than 4 nm so that said film can be easily broken during bonding of a part to said bump electrode through said film, said film having an anti-oxidation property, and having a property of preventing mutual diffusion with respect to Cu, wherein when said film is broken the part forms a junction with said Cu bump electrode through a break in said film.

* * * * *